(12) United States Patent
Hiratsuka

(10) Patent No.: US 8,216,868 B2
(45) Date of Patent: Jul. 10, 2012

(54) METHOD OF FABRICATING SEMICONDUCTOR LASER

(75) Inventor: Kenji Hiratsuka, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 12/778,391

(22) Filed: May 12, 2010

(65) Prior Publication Data

US 2010/0291718 A1 Nov. 18, 2010

(30) Foreign Application Priority Data

May 14, 2009 (JP) ................ P2009-117758

(51) Int. Cl.
*H01L 21/302* (2006.01)
(52) U.S. Cl. ................ 438/33; 257/E21.214
(58) Field of Classification Search .......... 438/33; 257/E21.214
See application file for complete search history.

(56) References Cited

U.S. PATENT DOCUMENTS

| | | | |
|---|---|---|---|
| 2005/0111508 A1* | 5/2005 | Nishikawa et al. | 372/50 |
| 2005/0277212 A1* | 12/2005 | Kamikawa | 438/21 |
| 2006/0046437 A1* | 3/2006 | Ozawa | 438/462 |
| 2008/0166852 A1* | 7/2008 | Kamikawa | 438/421 |

FOREIGN PATENT DOCUMENTS

JP 5-217969 8/1993

* cited by examiner

*Primary Examiner* — Alexander G. Ghyka
*Assistant Examiner* — Stanetta Isaac
(74) *Attorney, Agent, or Firm* — Smith, Cambrell & Russell, LLP

(57) ABSTRACT

A substrate product is formed, and the substrate product includes a first region, a second region, a protrusion structure, and first and second scribe marks. The first region includes sections arranged in first and second axes to form an array, and the second region is provided adjacent to the array. The protrusion structure is provided in the second region; the first and second scribe marks are provided in the second region; the first and second scribe marks extend along first and second reference lines, respectively; and the first and second reference lines define boundary of the sections. After sandwiching the substrate product between films, a first cleavage of the substrate product is performed along the first scribe mark to form a first laser bar and another substrate product, and a second cleavage of the other substrate product is performed along the second scribe mark to form a second laser bar and still another substrate product. Each section includes a laser stripe extending in the direction of the first axis, the substrate product includes a semiconductor substrate and a semiconductor laminate for the semiconductor laser provided on the semiconductor substrate. The protrusion structure is provided on the first reference line.

23 Claims, 10 Drawing Sheets (a)

(b)

(a)

(b)

(c)

(a)

(b)

METHOD OF FABRICATING SEMICONDUCTOR LASER

BACKGROUND OF THE INVENTION

1. Field of the Invention

The present invention relates to a method of fabricating a semiconductor laser.

2. Related Background Art

Patent literature 1 (Japanese Unexamined Patent Application Publication No. 05-217969) discloses a method of cleaving a wafer for a semiconductor laser. In this method, the semiconductor laser wafer is sandwiched by an ultraviolet cure tape and a transparent cover tape. A force is applied on the semiconductor laser wafer to the semiconductor laser wafer for cleavage with a blade. This method forms a laser bar, which is between the ultraviolet cure tape and the transparent cover tape.

SUMMARY OF THE INVENTION

In the method described in Patent literature 1, repetition of the above cleavage steps produces a number of laser bars. In the cleavage step, the application of the force for cleavage through the blade causes laser bars to turn between the two tapes, and brings adjacent two laser bars into direct contact with each other. One of the adjacent laser bars damages the cleavage plane of another laser bar during their direct contact with each other.

It is an object of the present invention to provide a method of fabricating a semiconductor laser, and the method can reduce the occurrence of the damage of its cleavage plane.

One aspect of the present invention provide a method of fabricating a semiconductor laser. The method comprises: the steps of: (a) forming a substrate product, the substrate product including a first region, a second region, and first and second scribe marks, the second region including a protrusion structure, the first region including plural device sections, the plural device sections being arranged in a direction of a first axis and a direction of a second axis, the direction of the first axis being different from the direction of the second axis, the second region extending in the direction of the first axis, the second region being adjacent to the first region, the first and second scribe marks being provided in at least one of the first region and the second region, the first and second scribe marks being provided on first and second reference lines, respectively, and the first and second reference lines defining boundary of the plural device sections and extending in the direction of the second axis; (b) sandwiching the substrate product between films; (c) performing a first cleavage of the substrate product by use of the first scribe mark to form a first laser bar and another substrate product, the first laser bar and the other substrate product being sandwiched by the films, and; (d) performing a second cleavage of the other substrate product by use of the second scribe mark to form a second laser bar and still another substrate product. The protrusion structure is provided on the first and second reference lines.

In the aspect of the present invention, the device sections in the first region include a stripe mesa structure extending in the direction of the first axis.

In the aspect of the present invention, the substrate product includes a semiconductor substrate and a semiconductor laminate provided on the semiconductor substrate, the substrate product has a primary surface and a secondary surface opposite to the primary surface, the semiconductor laminate is provided between the primary surface and the semiconductor substrate, and the plural scribe marks are provided on the primary surface.

In the aspect of the present invention, the cleavage of the other substrate product is carried out by pressing the secondary surface of the substrate product.

In the aspect of the present invention, the protrusion structure includes a ridge provided on the first and second reference lines.

In the aspect of the present invention, the protrusion structure includes first and second protrusions provided on the first and second reference lines, respectively.

In the aspect of the present invention, the substrate product includes a semiconductor substrate, a semiconductor laminate provided on the semiconductor substrate, and an insulating film provided on the semiconductor laminate, the insulating film includes an opening formed in each device section, and the opening of the insulating film is apart from the first and second reference lines.

In the aspect of the present invention, the substrate product includes a semiconductor substrate, a semiconductor laminate provided on the semiconductor substrate, and an electrode in contact with a surface of the semiconductor laminate, and a distance between the surface of the semiconductor laminate and a top of the electrode is greater than a distance between the surface of the semiconductor laminate and a top of the protrusion structure.

In the aspect of the present invention, the protrusion structure is provided in the second region, and the cleavage of the semiconductor product propagates along the scribe mark. The occurrence of the cleavage separates the protrusion structure into two parts. Each of the first and second laser bars, which are formed by cleaving the semiconductor product and the other semiconductor product, respectively, has the protrusion parts separated from the protrusion structure. When the other semiconductor product is pressed to form yet another semiconductor product and the second laser bar, the above other semiconductor product and the second laser turn round between the two films. Then, the protrusion structures of the first and second laser bars and the relevant other semiconductor product contact with each other. This can prevent the cleavage surface of the first laser bar from contacting with edges of the above other semiconductor product and the second laser, thereby reducing the occurrence of the damage of the cleavage surface.

In the aspect of the present invention, the protrusion structure includes plural protrusions, and these protrusions are provided in the second region and are arranged on the reference lines, respectively.

In the aspect of the present invention, the protrusion structure includes a single protrusion, and this protrusion is provided in the second region and extends on the reference lines. The present method facilitates the formation of the semiconductor product because the protrusion structure can be formed integrally.

In the aspect of the present invention, the protrusion structure comprises semiconductor. The present method facilitates the cleavage of the protrusion structure.

In the aspect of the present invention the protrusion structure comprises metal. The present method can allow the formation of the protrusion structure in the latter half later than the formation of the protrusion structure made of semiconductor.

In the aspect of the present invention, the protrusion structure comprises insulating material.

In the method according to the aspect of the present invention, the substrate product includes an electrode provided in each section, the electrode extends in the first axis, and the electrode is formed on the laser stripe. In the method according to the aspect of the present invention, the protrusion structure is provided on the first and second reference lines. In the method according to the aspect of the present invention, the protrusion structure is provided on the boundary of the sections. In the method according to the aspect of the present invention, the substrate product includes an insulating film provided on the semiconductor laminate, the insulating film includes an opening formed in each section, and the opening of the insulating film is apart from the first and second reference lines. In the method according to the aspect of the present invention, a part of the protrusion structure is located at an end face of the first laser bar, and a part of the protrusion structure is located at an end face of the other substrate product. In the method according to the aspect of the present invention, the first laser bar includes one part of the protrusion structure, and the other substrate product includes another part of the protrusion structure. In the method according to the aspect of the present invention, when the first cleavage of the substrate product is performed, an end face of the first laser bar is formed, and an end face of the other substrate product is formed. In the method according to the aspect of the present invention, the substrate product includes an electrode in contact with a surface of the semiconductor laminate, and a distance between the surface of the semiconductor laminate and a top of the electrode is greater than a distance between the surface of the semiconductor laminate and a top of the protrusion structure. In the method according to the aspect of the present invention, the first and second cleavages are carried out with a blade having an edge, and performing the first cleavage comprises pressing the substrate product in contact with the edge of the blade, and performing the second cleavage comprises pressing the substrate product in contact with the edge of the blade. In the method according to the aspect of the present invention, the protrusion structure extends across the first and second reference lines. In the method according to the aspect of the present invention, the first and second scribe marks are apart from the protrusion structure.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

DESCRIPTION OF THE PREFERRED EMBODIMENTS

The teachings of the present invention will readily be understood in view of the following detailed description with reference to the accompanying drawings illustrated by way of example. When possible, parts identical to each other will be referred to with reference symbols identical to each other.

Figure 1:
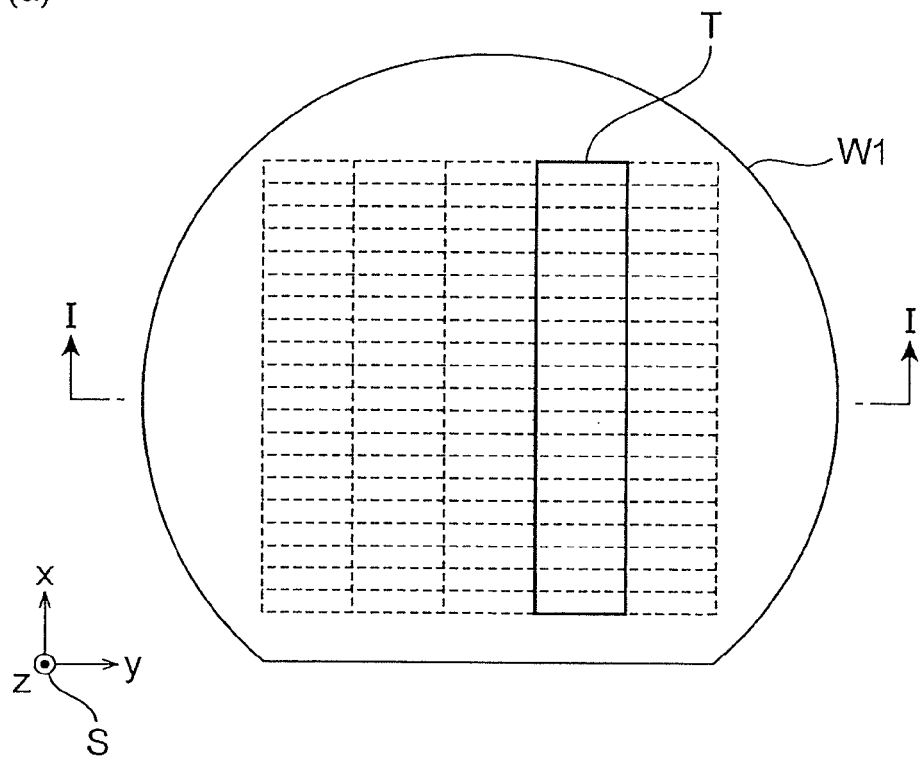
FIG. 1 is a schematic view showing the structure of a substrate product in accordance with a first embodiment of the present invention.
Figure 1:
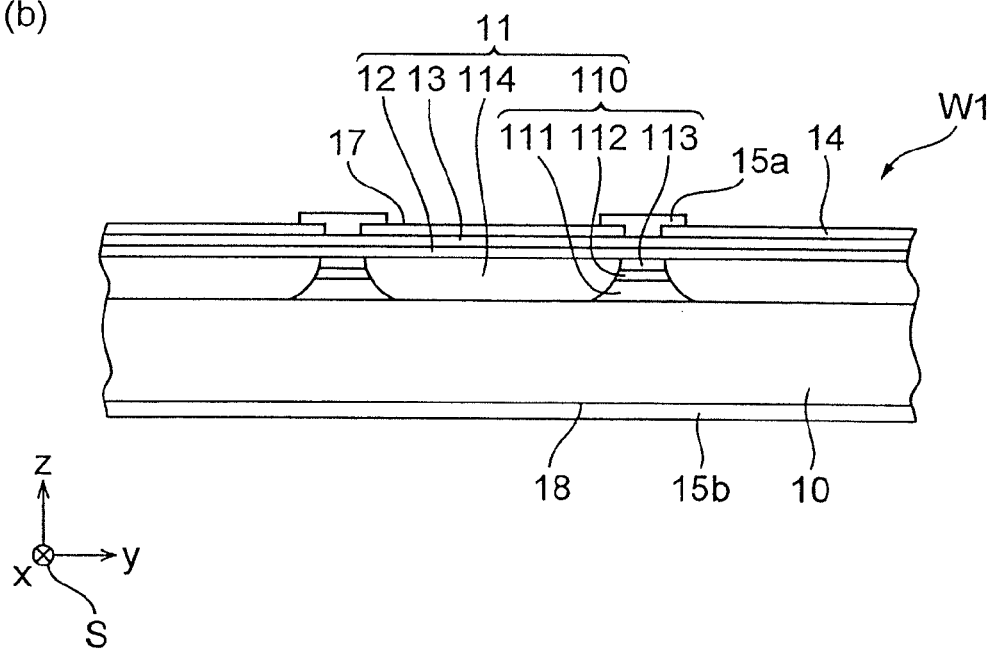

FIG. 1 is a schematic view showing a substrate product in accordance with the present embodiment. Part (a) of FIG. 1 shows a top view of the substrate product, and Part (b) of FIG. 1 shows a cross section, taken along I-I line, of the semiconductor product. The orthogonal coordinate system "S" is shown in Parts (a) and (b) in FIG. 1. With reference to Part (a) in FIG. 1, a substrate product "W1" includes a number of sections for substrate products "T" arranged in the first direction, e.g. the y-axis of the orthogonal coordinate system "S". In this example, each of the semiconductor products "T" has a stripe shape. The substrate product "W1" includes a semiconductor substrate 10 and a semiconductor laminate structure 11 provided thereon. The semiconductor substrate 10 may comprise group III-V semiconductor compound, such as GaAs, InP and GaN. The substrate product "W1" has a primary surface 17 and a backside surface 18, and the primary surface 17 is opposite to the backside surface 18. The semiconductor laminate structure 11 is provided between the primary surface 17 and the semiconductor substrate 10. The substrate product "W1" further includes an insulating layer 14, a first electrode 15a and a second electrode 15b. The insulating layer 14 is provided on the semiconductor laminate structure 11. The first electrode 15a is formed in the opening of insulating layer 14 and on the insulating layer 14, and the second electrode 15b is formed on the backside surface 18.

The semiconductor laminate structure 11 includes a semiconductor mesa 110 and a burying region 114. The semiconductor mesa 110 is formed on the semiconductor substrate 10, and the burying region 114 is provided on the side of the semiconductor mesa 110. The semiconductor mesa 110 has a stripe shape, and extends in the x-axis of the orthogonal coordinate system "S". The semiconductor mesa 110 includes an n-type cladding layer 111, an active layer 112 and a p-type cladding layer 113. The n-type cladding layer 111, the active layer 112 and the p-type cladding layer 113 are sequentially arranged in the normal direction of the primary surface 17 of the semiconductor substrate 10. In this example, the x-axis indicates a direction in which the semiconductor mesa 110 extends, the y-axis indicates a direction in which the substrate products "T" are arranged, and the z-axis indicates a direction in which the n-type cladding layer 111, the active layer 112 and the p-type cladding layer 113 are sequentially arranged on the semiconductor substrate 10.

Figure 2:
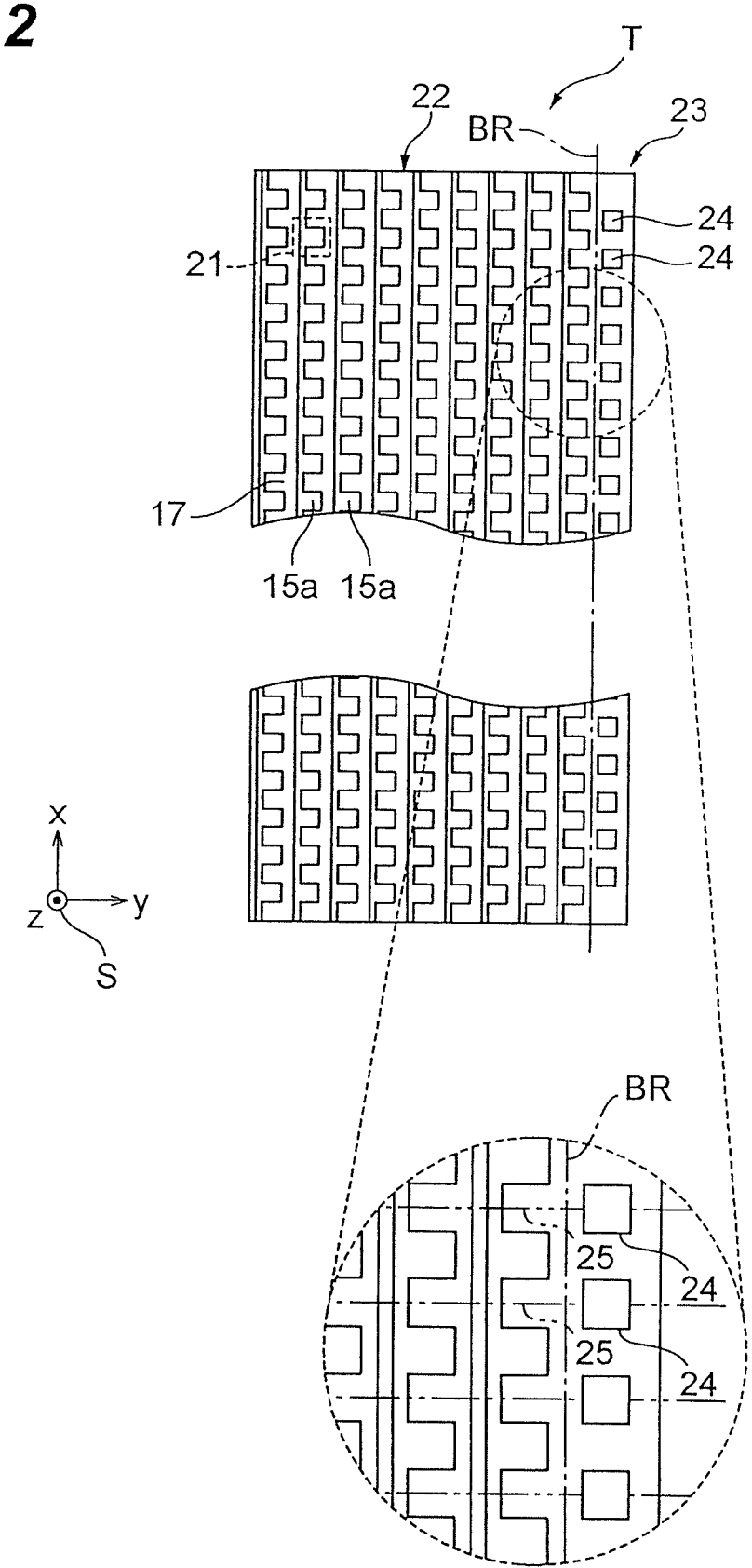
FIG. 2 is a magnified view showing a semiconductor product made of the substrate product shown in FIG. 1.

FIG. 2 shows a magnified view of the semiconductor product "T". The orthogonal coordinate system "S" is also shown in FIG. 2. The semiconductor product "T" includes a first region 22 and a second region 23. The first region 22 includes a plural of device sections which are arrayed in the x- and y-axis directions. The first region 22 is adjacent to the second region 23. The second region 23 extends in the x-axis direction, and is located at one edge of the semiconductor product "T". The reference symbol "BR" indicates a boundary between the first region 22 and the second region 23. The semiconductor product "T" includes a protrusion structure provided in the second region 23, and the protrusion structure is located on plural reference lines 25 for cleavage. The reference lines 25 for cleavage extend in the y-axis direction, and indicate the y-directional boundary of the device sections. The protrusion structure includes plural protrusions 24. These protrusions 24 are located in the second region 23, and are arranged on the reference lines 25, respectively.

In the substrate product "W1", the semiconductor products "T" may be periodically arranged in the y-axis direction. Each of the semiconductor products "T" includes the first region 22 and the second region 23, and the first region 22 has an array of device sections 21, and the second region 23 has an arrangement of protrusions 24. The device sections 21 are prepared for semiconductor lasers each having the part of the semiconductor mesa 110. In each device section 21, the laser stripe including the semiconductor mesa 110 extends in the x-axis direction, the protrusions 24 are arranged in the x-axis direction. The height of each protrusion 24 is larger than that of the electrodes 15a that are on the surface 17a of the semiconductor laminate structure, and each protrusion 24 is higher than any other structures on and in the semiconductor laminate structure. Each protrusion 24 includes a base, and the base can be composed of, for example, semiconductor. Protruding structures are not limited to the protrusion structure that includes the plural protrusions 24 arranged on the respective reference lines for cleavage, and for example, the protruding structure may include single protruding member, and the protruding member may be a ridge that extends in the x-axis direction and is located on every reference line for cleavage. Cleavage separates the ridge into parts that the laser bars formed by the cleavage include, respectively. The semiconductor product "T" may include plural second regions 23. The arrangements of the first region 22 and the second region 23 are not limited to the present embodiment in which the second region 23 is located at the edge of the arrangement of the first region 22, and the second region 23 may be located between two first regions, each of which includes one or more rows of device sections. In the semiconductor product "T", the second region 23 can be located at a desired position in the arrangement of rows of device sections. The laser bar can be composed of one column of device sections.

Figure 3:
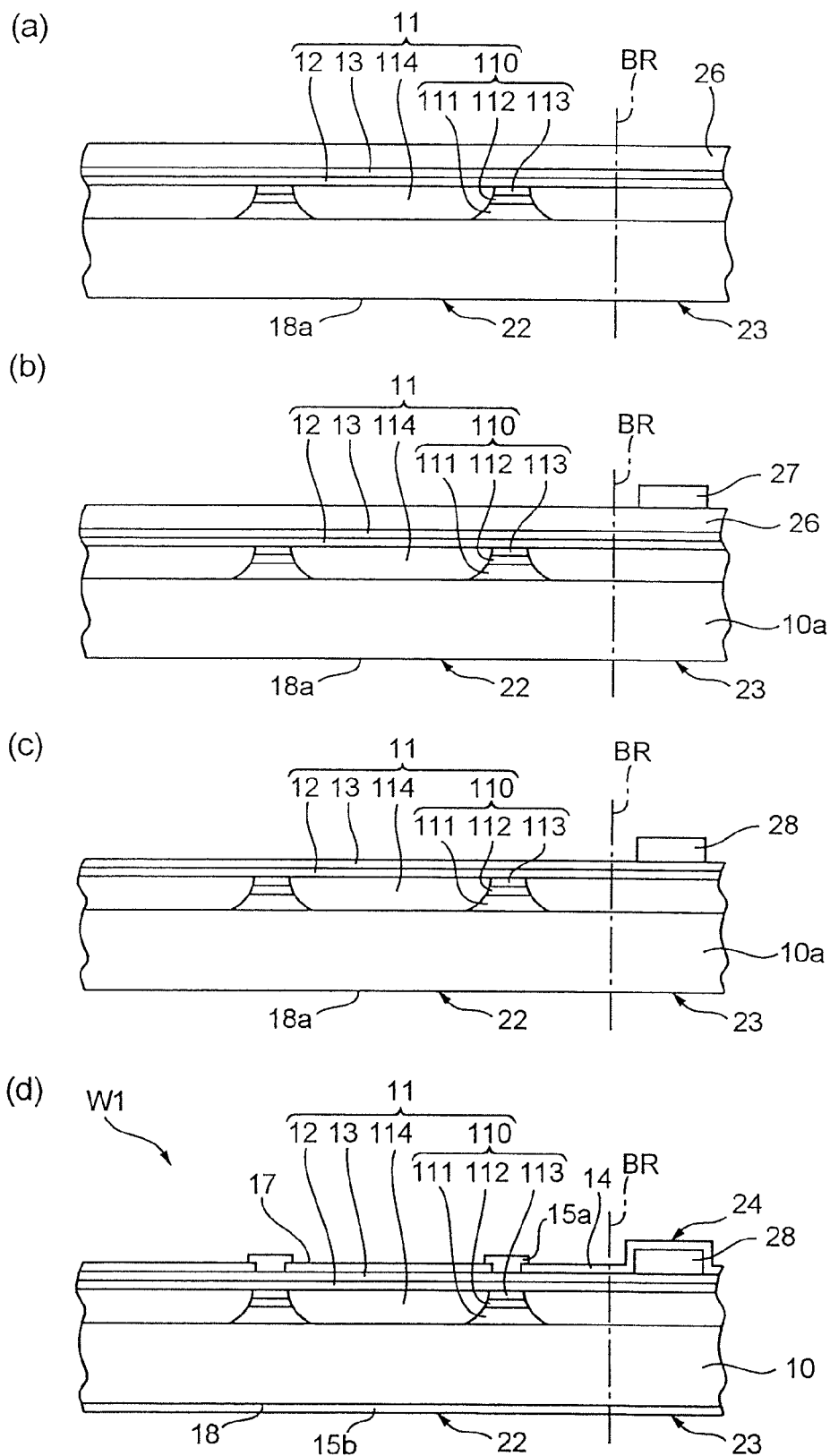
FIG. 3 is a schematic view showing primary steps in the method of fabricating a substrate product.

The method of fabricating a substrate product "W1" is explained below. FIG. 3 shows a flow chart including primary steps in the method of fabricating the substrate product "W1". A shown in Part (a) of FIG. 3, the semiconductor mesa 110 having the n-type cladding layer 111, the active layer 112 and the p-type cladding layer 113 is formed on the semiconductor substrate 10a, and the burying region 114 is grown on the side of the semiconductor mesa 110. A p-type cladding layer 12 and a p-type contact layer 13 are grown on the semiconductor mesa 110 and the burying region 114. These steps complete the semiconductor laminate structure 11 on the semiconductor substrate 10a. After forming the semiconductor laminate structure 11, a semiconductor layer 26 for the protrusion structure is grown on the p-type contact layer 13. The growth of the above semiconductor layer 26 can also be performed by, for example, organometallic vapor-phase epitaxy.

The n-type cladding layer 111 can be composed of, for example, n-type InP, and its thickness is about 550 nanometers. The active layer 112 can be composed of, for example, a GaInAsP multiple quantum well structure, and its thickness is about 260 nanometers. The p-type cladding layer 113 can be composed of, for example, p-type InP, and its thickness is about 450 nanometers. The burying region 114 can be composed of two layers, such as p-type InP and n-type InP. The p-type cladding layer 12 can be composed of, for example, p-type InP, and its thickness is about 1.6 micrometers. The p-type contact layer 13 can be composed of, for example, p-type GaInAs, and its thickness is about 0.6 micrometers. The semiconductor layer 26 can be composed of, for example, InP, and its thickness is about 3 micrometers. The thickness of the semiconductor layer 26 can be larger than that of any other layer in the semiconductor laminate structure 11.

As shown in Part (b) of FIG. 3, a mask 27 is formed on the semiconductor layer 26 by photolithographic technique. The mask 27 has patterns, and the patterns are formed in the second region 23, and the patterns are may be arranged on the reference lines 25 for cleavage, respectively. Next, as shown in Part (c) of FIG. 3, the patterns of the mask 27 define the locations and the shapes of protruding bases 28, respectively. The semiconductor layer 26 is etched using the mask 27 to form protruding bases 28 in the second region 23 and expose the surface of the p-type contact layer 13 in the first region 22. Thereafter, the mask 27 is removed. In the above process, the protruding bases 28 of the protrusion structure have been formed.

As shown in Part (d) of FIG. 3, an insulating film is grown on the p-type contact layer 13 and the protruding bases 28. The surfaces of the p-type contact layer 13 and the protruding bases 28 are covered with the insulating film. The insulating film can be deposited by chemical vapor deposition. The insulating film can be composed of silicon oxide, such as $SiO_2$, and its thickness can be, for example, about 350 nanometers. Openings are formed by etching in the insulating film to form an insulating layer 14, and electrodes 15a are formed in the openings of the insulating layer 14 and on the insulating layer 14. Then, the backside of the semiconductor substrate 10a is polished to form the polished semiconductor substrate 10, the thickness of which is about 100 micrometers. The semiconductor substrate 10 has a polished surface, e.g., a back side 18, and an electrode 15b is formed on the back side 18.

The substrate product "W1" has been formed through the above process. The substrate product "W1" includes an arrangement of the protrusions 24 provided on the semiconductor laminate structure 11, and the protrusions 24 include the protruding bases 28 located on the respective reference lines 25 for cleavage, and the protruding bases 28 are made of semiconductor. Alternately, the protrusions 24 may include protruding bases composed of insulating material, and/or may include protruding bases composed of metal. Other embodiments of methods for fabricating a substrate product are explained below.

Figure 4:
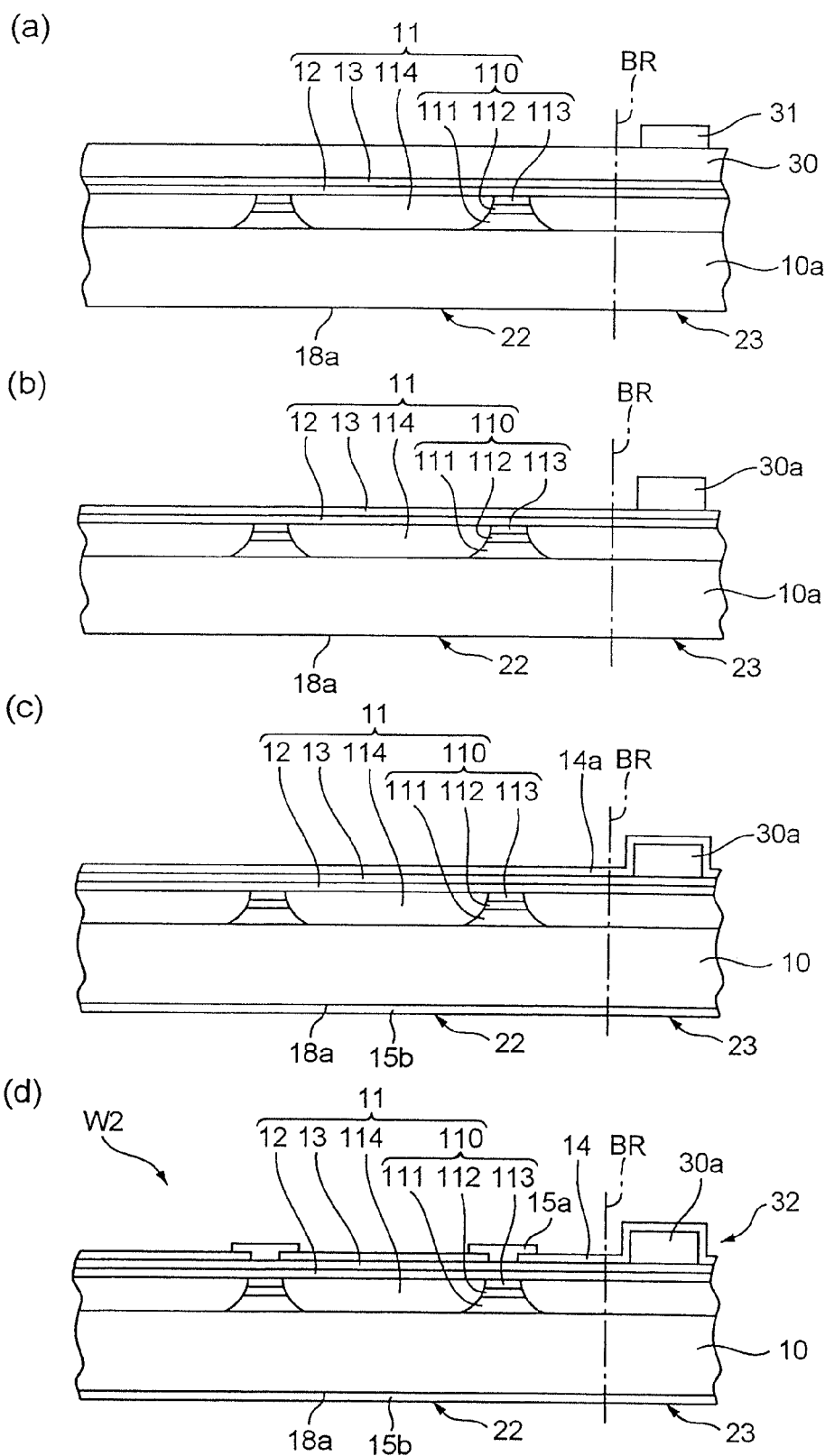
FIG. 4 is a schematic view showing primary steps in the method of fabricating a substrate product.

In another embodiment, the method of fabricating a substrate product is explained below, and the substrate product comprises protruding bases made of insulating material. FIG. 4 is a schematic view showing primary steps in the method of fabricating the substrate product that has protruding bases made of insulating material. In the first step, the semiconductor laminate structure 11 is formed on the semiconductor substrate 10a, as already described above.

After forming the semiconductor laminate structure 11 on the semiconductor substrate 10a, a first insulating film 30 is deposited on the p-type contact layer 13, as shown in Part (a) of FIG. 4, and a mask 31 is formed on the first insulating film 30. The first insulating film 30 can be composed of silicon oxide, such as $SiO_2$, and its thickness is about 2.5 micrometers. The mask 31 has patterns on the second regions 23, and these patterns are located on reference lines 25 for cleavage, respectively.

Next, as shown in Part (b) of FIG. 4, the first insulating film 30 is etched using the mask 31 to form protruding bases of insulator and expose the p-type contact layer 13. After the etching, the patterns of the mask 31 are still on the tops of the protruding bases, and the mask 31 is removed to form protruding bases 30a. Then, as shown in Part (c) of FIG. 4, a second insulating film 14a is formed on the protruding bases 30a and the exposed surface of the p-type contact layer 13. As shown in Part (d) of FIG. 4, openings are formed in the second insulating film 14a to form a second insulating layer 14, and electrodes 15a are formed in the openings of the second insulating layer 14, and is contact with the p-type contact layer 13. Then, the backside of the semiconductor substrate 10a is polished to form the polished semiconductor substrate 10, the thickness of which is about 100 micrometers. The semiconductor substrate 10 has a polished surface, e.g., a back side 18, and an electrode 15b is formed on the back side 18 of the semiconductor substrate 10. Through the above process, a substrate product "W2" has been formed. The substrate product "W2" comprises protrusions 32, each of which includes protruding portion 30a of insulator, and the protrusions 32 are provided on the reference lines 25, respectively.

Figure 5:
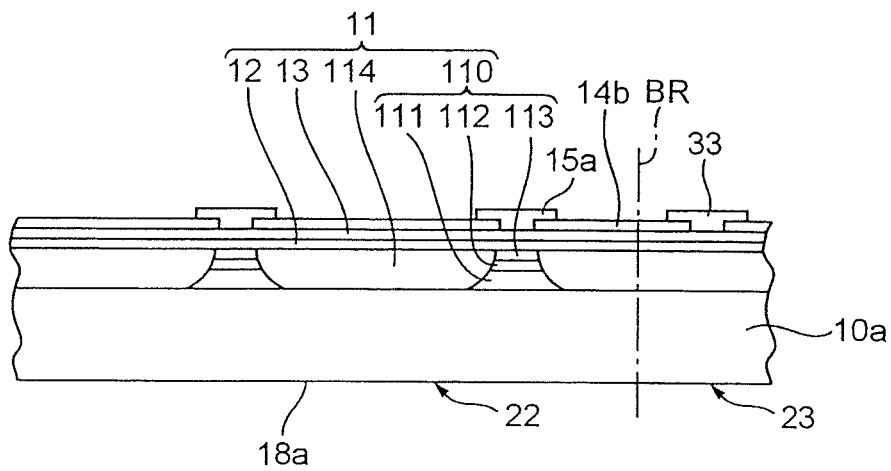
FIG. 5 is a schematic view showing primary steps in the method of fabricating a substrate product.
Figure 5:
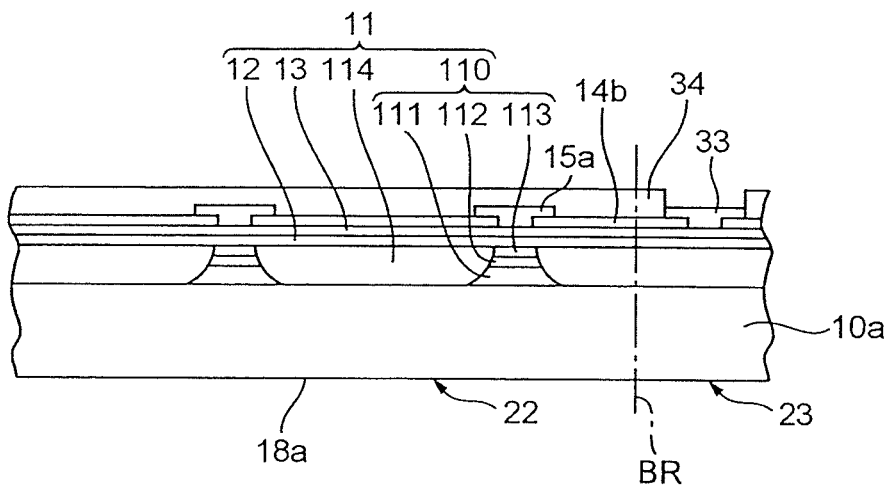
Figure 5:
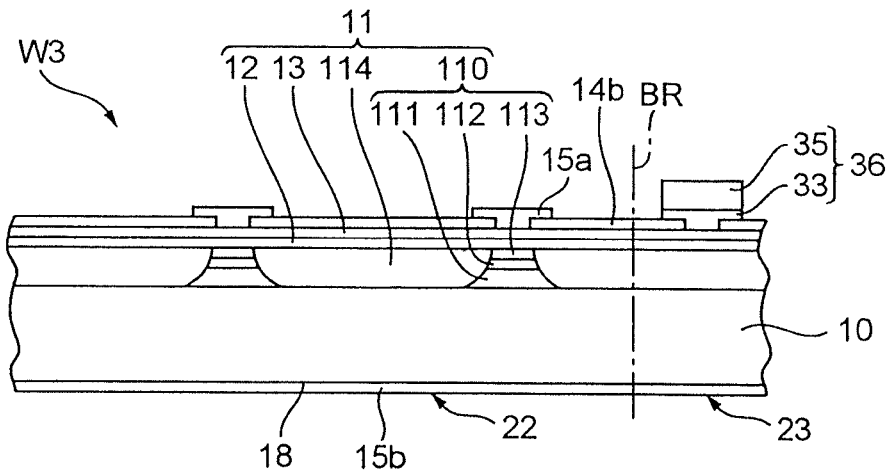

In the next embodiment, the method of fabricating a substrate product is explained below. The substrate product comprises protruding bases made of metal. FIG. 5 is a schematic view showing primary steps in the method of fabricating the substrate product that has protruding bases made of metal. In the first step, the semiconductor laminate structure 11 is formed on the semiconductor substrate 10a, as described above.

After forming the semiconductor laminate structure 11 on the semiconductor substrate 10a, as shown in Part (a) of FIG. 5, an insulating layer 14b is formed on the p-type contact layer 13. The insulating layer 14b can be composed of silicon oxide, such as $SiO_2$, and its thickness is about 350 nanometers. The insulating layer 14b has an arrangement of first openings, and these first openings are provided on the device sections 21 in the first region 22 of the substrate product. The insulating layer 14b has one or more openings in the second region 23, and the openings are positioned to the reference scribe marks, respectively. The p-type contact layer 13 is exposed at the openings. Metallic material is formed on the insulating layer 14b and is composed of, for example, Ti/Pt/Au. The metallic material is patterned to form electrodes and metallic bases. The electrodes are provided in the openings in the first region 22, and the metallic bases are provided in the openings in the second region 23. A plated layer is formed by plate processing on the electrodes and the metallic bases to form a metallic laminate, and is composed of, for example, gold (Au). The metallic laminate includes a number of metallic parts. The metallic parts in the first openings are provided for the electrodes 15a, and the metallic parts in the second openings are provided for the metallic bases 33 for the protrusions.

Next, as shown in Part (b) of FIG. 5, a mask 34 is formed on the electrodes 15a and the insulating film 14b. The mask has one or more openings located on the metallic bases 33. As shown in Part (c) of FIG. 5, another plated layer is formed by plate processing on the metallic bases 33 to form a metallic protrusions 35, and is composed of, for example, gold (Au). Thereafter, the mask 34 is removed. Then, the backside 18a of the semiconductor substrate 10a is polished to form the polished semiconductor substrate 10, the thickness of which is about 100 micrometers. The semiconductor substrate 10 has a polished surface (back side) 18, and an electrode 15b is formed on the back side 18. Through the above process, a substrate product "W3" has been formed. The substrate product "W3" comprises protrusions 32, each of which includes protruding portion 30a of insulator, and the protrusions 35 are provided on the reference lines 25, respectively.

Figure 6:
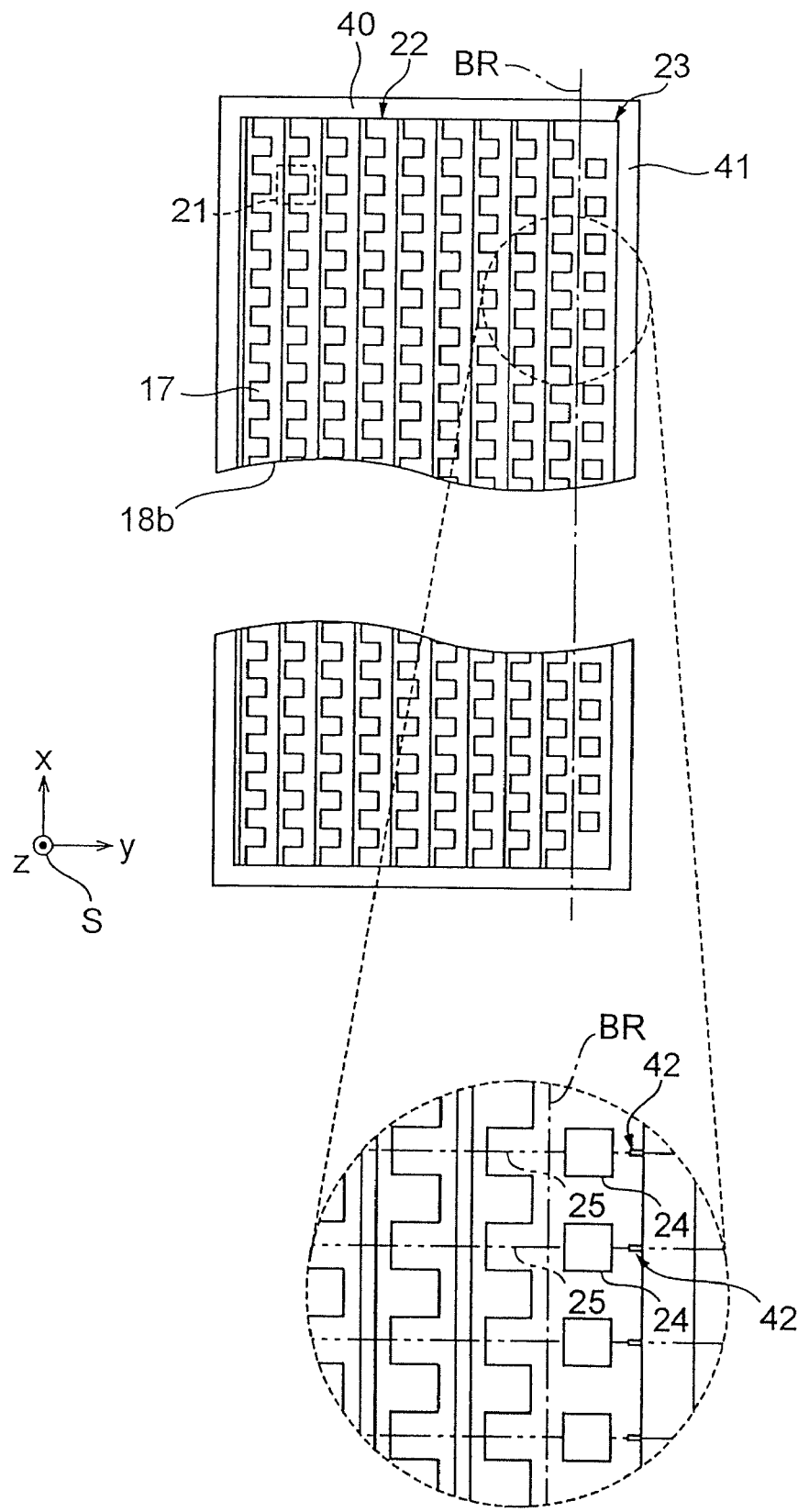
FIG. 6 is a schematic view showing a semiconductor product made of the substrate product.

The method of fabricating a semiconductor laser is described below. FIG. 6 is a schematic view showing a semiconductor product. The orthogonal coordinate system "S" is shown in FIG. 6. As shown in FIG. 6, forming the semiconductor product 40 is carried out. Specifically, the substrate product "W1" is scribed to form a number of scribe marks along the surface of the substrate product "W1", and the substrate product "W1" is cleaved at the scribe marks to form at least one semiconductor product. The backside surface 18b of the semiconductor product is applied to the film 41. The backside surface 18b is opposite to the primary surface 17 of the substrate product on which the electrodes 15a are formed. Scribe grooves 42 are formed along the surface of the semiconductor product to form a semiconductor product 40. The scribe grooves 42 are arranged on the respective cleavage lines 25. The scribe grooves 42 extend in the y-axis direction from the edge of the second region 23. The bottoms of the scribe grooves 42 are in the p-type contact layer 13, and if needed, are deeper than the position of the p-type contact layer 13. The scribe grooves 42 are made by a scribing apparatus, such as diamond cutter. The scribe grooves 42 may be formed in at least one of the first region 22 and the second region 23, and a scribe groove formed on the first region 22 extends in the y-axis direction from the edge of the first region 22.

Figure 7:
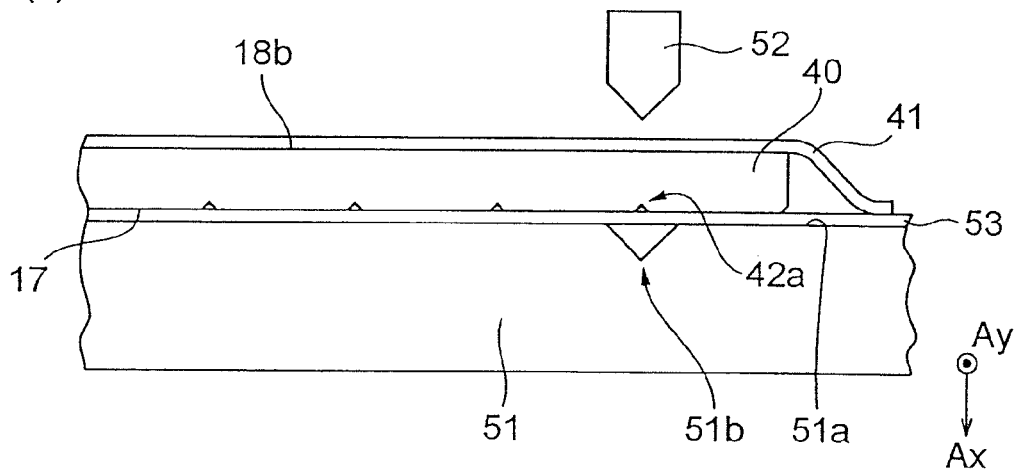
FIG. 7 is a schematic view showing primary steps in the method of fabricating a semiconductor laser.
Figure 7:
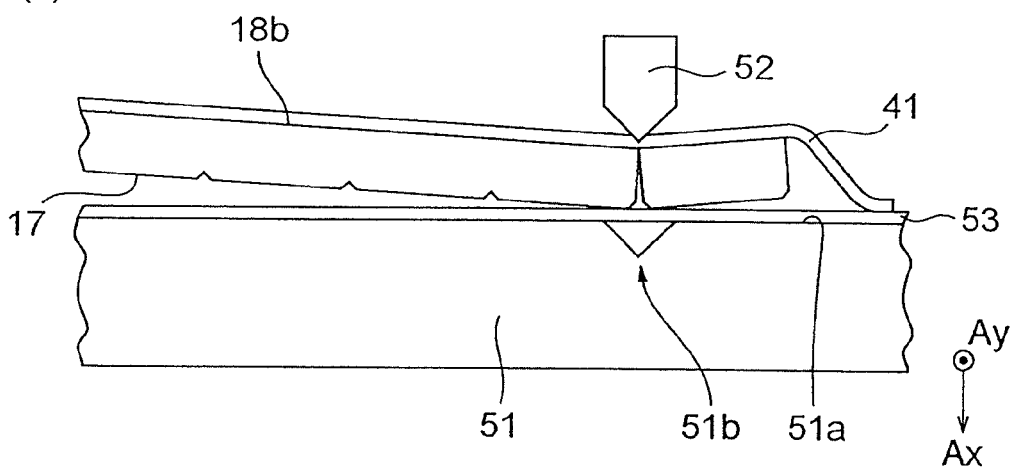
Figure 7:
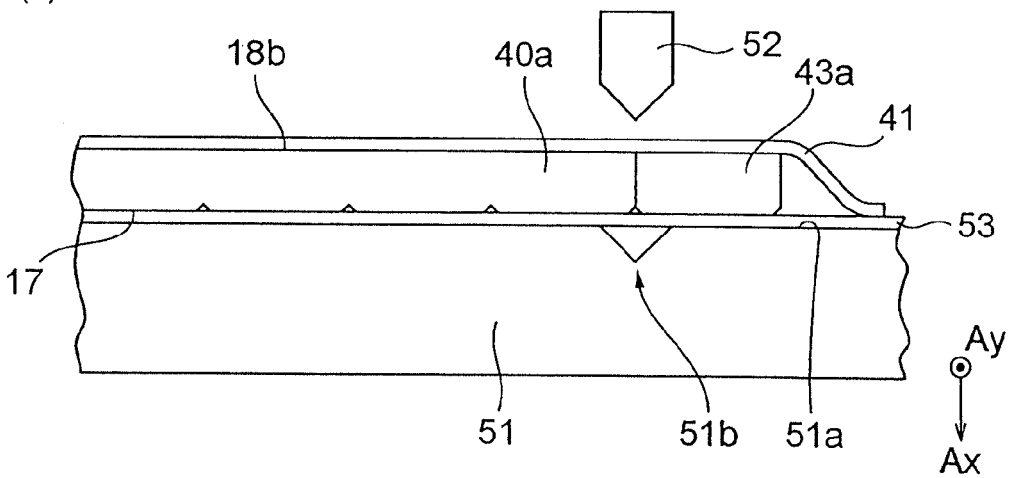

As shown in Part (a) of FIG. 7, the semiconductor product is loaded on the supporting surface 51a of the supporting base 51 such that the scribe groove 42a of the scribe grooves 42, which is the rightmost groove, is aligned with a groove 51b of the supporting base 51. The supporting surface 51a is perpendicular to the reference plane that the Ax and Ay axes define. The primary surface 17 of the semiconductor product 40 faces the supporting face 51a of the supporting base 51. Since a film 53 is located under the semiconductor product 40, the film 53 is provided between the semiconductor product 40 and the supporting surface 51a of the supporting base 51.

As shown in Part (b) of FIG. 7, a blade 52 is moved in the direction Ax to the backside surface 18 of the semiconductor product 40, and the blade 52 presses the backside surface 18. A force is applied through the pressing to the backside surface of the semiconductor product 40 exactly aligned with the front plane scratch, e.g., scribe groove 42a. This pressing causes cleavage of the semiconductor product 40 along a scribing groove 42a located at a position, which is opposite to the above position in the backside surface 18, in the primary surface. Cleavage of the semiconductor product 40 propagates along a reference line 25 along which a scribe groove 42a is formed. This cleavage forms another semiconductor product 40a and a first laser bar 43a.

Figure 8:
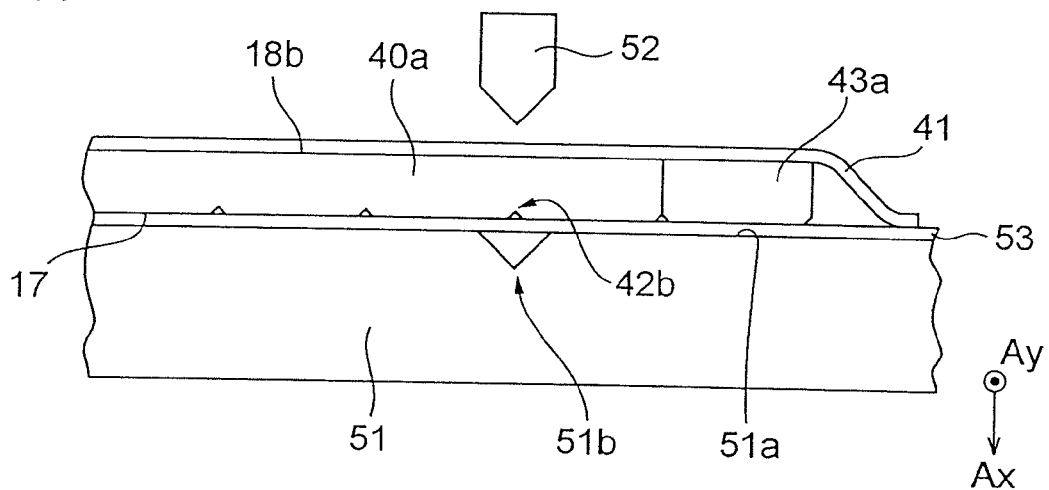
FIG. 8 is a schematic view showing primary steps in the method of fabricating a semiconductor laser.
Figure 8:
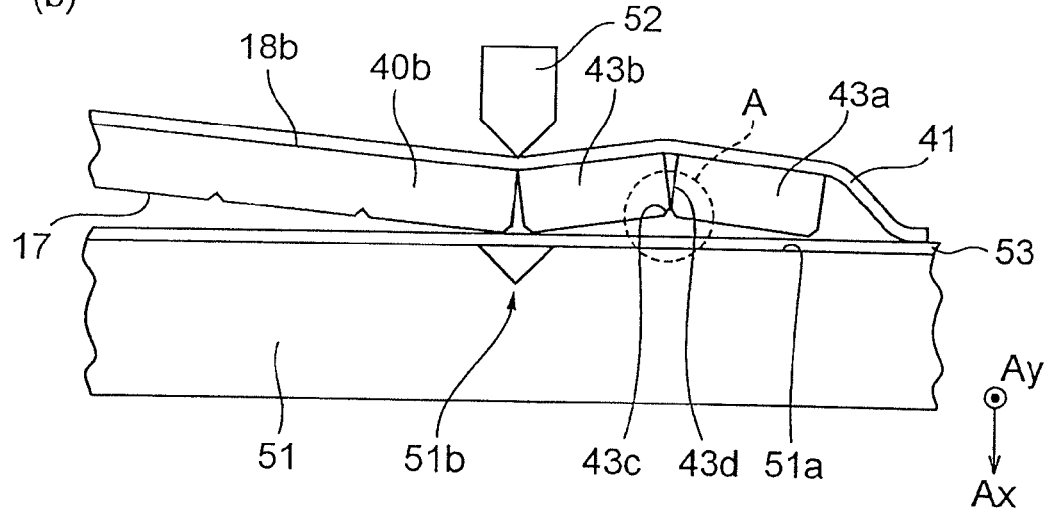

As shown in Part (a) of FIG. 8, the semiconductor product 40a is moved on the supporting base 51 to align a scribe groove 42b of the semiconductor product 40a with the groove 51b. As shown in Part (a) of FIG. 8, the blade 52 is moved in the direction Ax to the backside surface 18 of the semiconductor product 40a, and the blade 52 presses the backside surface 18. This pressing applies a force to the semiconductor product 40a at a position in the backside surface 18 to cause the semiconductor product 40a to cleave, after aligned with the front plane scratch, e.g., scribe groove 42b located at a position, which is opposite to the above position in the backside surface 18, in the primary surface. Cleavage of the semiconductor product 40a propagates along a reference line 25 along which a scribe groove 42b is formed. This cleavage forms another semiconductor product 40b and a first laser bar 43b.

Figure 9:
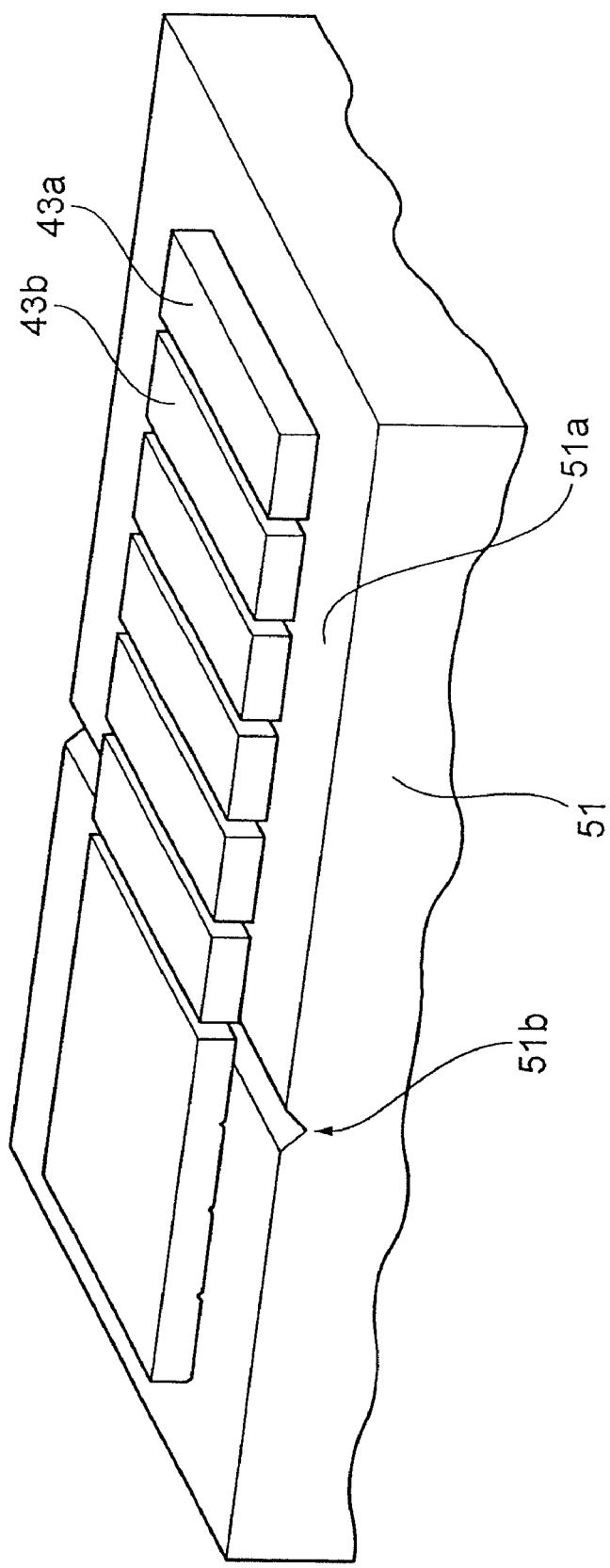
FIG. 9 is a schematic view showing a number of laser bars that are formed by repeated cleavage of the semiconductor product shown in FIG. 6.

The cleavage step is repeatedly carried out to provide a number of laser bars as shown in FIG. 9. In order to clearly show the arrangement of the laser bars, films 41 and 53 are omitted in FIG. 9. After forming the plural laser bars in turn, a laser bar is separated at every boundary of the device sections 21 into semiconductor laser chips.

Figure 10:
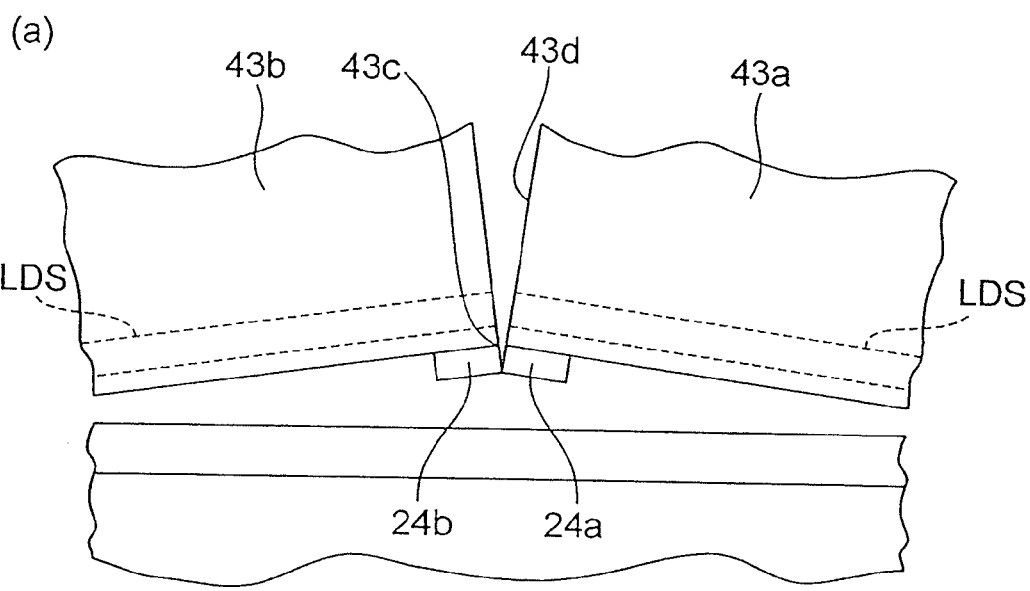
FIG. 10 is a magnified view showing a region indicated by dashed circle "A" in FIG. 8.
Figure 10:
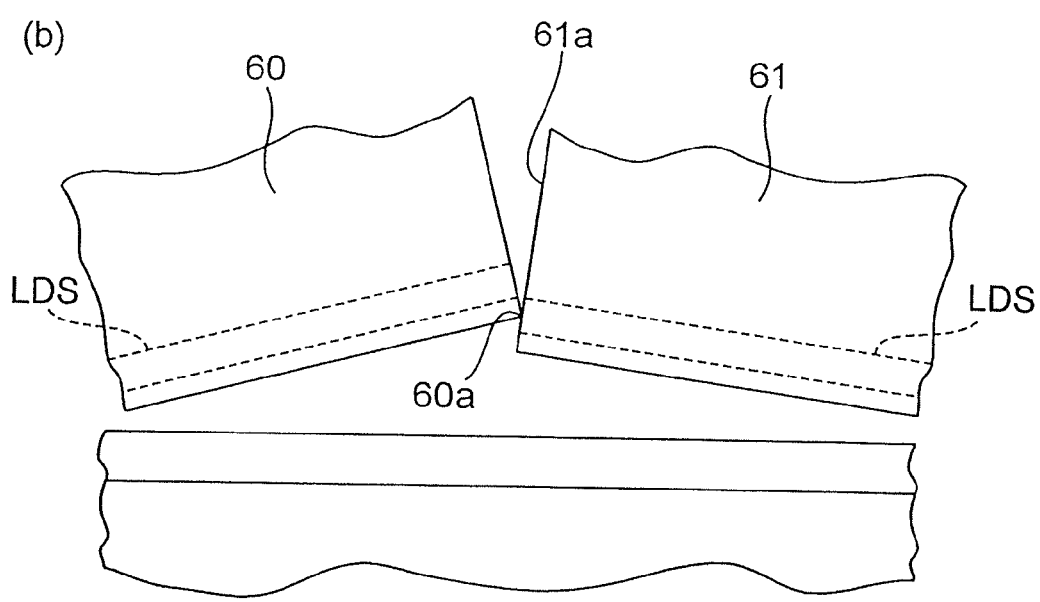

With reference to FIG. 10, the method of fabricating a semiconductor laser is further explained below. FIG. 10 show a magnified view of Region "A" depicted in a dash line in Part (b) of FIG. 8. Dashed lines indicate laser stripes "LDS". In the method of fabricating a semiconductor laser, the protrusions 24 are formed on the second region 23, and extend in the direction of the scribe lines 25. Cleavage of the semiconductor product 40 propagates along a reference line 25 along which the scribe groove 42 is formed. This cleavage separates a protrusion 24 into protrusion parts 24a and 24b. The first and second laser bars 43a and 43b, which are formed from the semiconductor product 40 and the other the semiconductor product 40a, have the protrusion parts 24a and 24b, respectively, into which protrusion 24 is separated. Accordingly, when the semiconductor product 40a is pressed to form another semiconductor product 40b and a second laser bar 43b, the second laser bar 43b turns round between the films 41 and 53, and in such a situation, the protrusion part 24a of the first laser bar 43a and the protrusion part 24b of the second laser bar 43b first butts each other as shown in Part (a) of FIG. 10. The protrusion parts 24a and 24b prevent the edge of the second laser bar 43b from directly contacting the cleavage surface 43d of the first laser bar 43a, thereby reducing the occurrence of damage of the cleavage surface 43d.

In the method of fabricating a semiconductor laser from a semiconductor product that does not have any protrusions that the semiconductor laser according to the present embodiment includes, when the conventional semiconductor product is pressed to repeatedly form laser bars, these laser bars turn round between films. In such a situation, an edge 60a of a laser bar 60 contacts a cleavage face 61a of another laser bar 61 to damage the cleavage face 61a. The emitting area of a cleavage face from which laser beam emits is located close to the primary surface. The edge 60a of a laser bar 60 contacts the cleavage face 61a of another laser bar 61 to damage the emitting area in the cleavage face, leading to the reduction in characteristics and reliability of the semiconductor laser formed as above. But, the method according to the present embodiment can prevent the occurrence of the damage in the semiconductor laser, and the characteristics and reliability of the semiconductor laser cannot be reduced.

Having described and illustrated the principle of the invention in a preferred embodiment thereof, it is appreciated by those having skill in the art that the invention can be modified in arrangement and detail without departing from such principles. Details of structures of these devices can be modified as necessary. We therefore claim all modifications and variations coming within the spirit and scope of the following claims.

What is claimed is:

1. A method of fabricating a semiconductor laser, comprising the steps of:

forming a substrate product, the substrate product including a first region, a second region, and first and second scribe marks, the first region including plural device sections, the second region including a protrusion structure without the plural device sections, each device section including the semiconductor laser, the plural device sections being arranged in a direction of a first axis and a direction of a second axis, the direction of the first axis being different from the direction of the second axis, the second region extending in the direction of the first axis, the first and second scribe marks being provided in at least one of the first region and the second region, the first and second scribe marks being provided on first and second reference lines, respectively, and the first and second reference lines defining boundary of the plural device sections and extending in the direction of the second axis;

sandwiching the substrate product between films;

performing a first cleavage of the substrate product by use of the first scribe mark to form a first laser bar and another substrate product, the first laser bar and the other substrate product being sandwiched by the films, and;

performing a second cleavage of the other substrate product by use of the second scribe mark to form a second laser bar and still another substrate product, the second laser bar and still other substrate product being sandwiched by the films;

wherein the protrusion structure is provided on the first and second reference lines, wherein the second cleavage of the other substrate product is carried out by pressing the other substrate product located between the films, wherein in the step of performing a first cleavage of the substrate product, the protrusion structure is separated into a first part and a second part, the first laser bar includes the first part, the other substrate product includes the second part, wherein in the step of performing a second cleavage of the substrate product, the second part of the protrusion structure is separated into a third part and a fourth part, the second laser bar includes the third part, and still other substrate product includes the fourth part, and wherein in the step of performing a second cleavage of the substrate product, the second laser bar and still other substrate product have been formed between the films, and the pressing causes the first and second laser bars to turn around between the films such that the first part of the first laser bar and the third part of the second laser bar make first contact with each other.

2. The method according to claim 1, wherein the device sections in the first region include a stripe mesa structure extending in the direction of the first axis.

3. The method according to claim 1, wherein the protrusion structure includes a ridge provided on the first and second reference lines.

4. The method according to claim 1, wherein the protrusion structure comprises a semiconductor.

5. The method according to claim 1, wherein the protrusion structure comprises a metal.

6. The method according to claim 1, wherein the protrusion structure comprises an insulator.

7. The method according to claim 6, wherein the insulator comprises one of silicon oxide and silicon nitride.

8. The method according to claim 1, wherein the protrusion structure includes first and second protrusions provided on the first and second reference lines, respectively.

9. The method according to claim 1, wherein the substrate product includes an electrode provided in each section, the electrode extends in the direction of the first axis.

10. The method according to claim 1, wherein the protrusion structure is provided on the boundary of the device sections.

11. The method according to claim 1, wherein the substrate product includes a semiconductor substrate, a semiconductor laminate provided on the semiconductor substrate, and an insulating film provided on the semiconductor laminate, the insulating film includes an opening formed in each device section, and the opening of the insulating film is apart from the first and second reference lines.

12. The method according to claim 1, wherein a part of the protrusion structure is located at an end face of the first laser bar, and a part of the protrusion structure is located at an end face of the other substrate product.

13. The method according to claim 1, wherein when the first cleavage of the substrate product is performed, an end face of the first laser bar is formed, and an end face of the other substrate product is formed.

14. The method according to claim 1, wherein the substrate product includes a semiconductor substrate, a semiconductor laminate provided on the semiconductor substrate, and an electrode in contact with a surface of the semiconductor laminate, and a distance between the surface of the semiconductor laminate and a top of the electrode is greater than a distance between the surface of the semiconductor laminate and a top of the protrusion structure.

15. The method according to claim 1, wherein the first and second cleavages are carried out with a blade having an edge, and performing the first cleavage comprises pressing the substrate product hi contact with the edge of the blade, and performing the second cleavage comprises pressing the substrate product in contact with the edge of the blade.

16. The method according to claim 1, wherein the protrusion structure extends across the first and second reference lines.

17. The method according to claim 1, wherein the first and second scribe marks are apart from the protrusion structure.

18. The method according to claim 1, wherein the first scribe mark includes a groove and the groove of the first scribe mark extends along the first reference line,
wherein the protrusion structure includes a first protrusion and the first protrusion is located above the first reference line, and
wherein the first scribe mark includes a groove, the protrusion structure includes a first protrusion, and a width of the first protrusion is greater than that of the groove.

19. The method according to claim 18, wherein the width of the first protrusion is defined in a direction perpendicular to the first reference line, and the width of the groove is defined in a direction perpendicular to the first reference line.

20. The method according to claim 1, wherein the first scribe mark includes a groove and the groove of the first scribe mark extends along the first reference line, and
wherein the protrusion structure includes a first protrusion and the first protrusion is located above the first second reference line.

21. A method of fabricating a semiconductor laser, comprising the steps of:
forming a substrate product, the substrate product including a first region, a second region, and first and second scribe marks, the first region including plural device sections, each section corresponding to a semi conductor laser chip, the plural device sections being arranged in a direction of a first axis and a direction of a second axis to provide a device section array in the first region, the second region including a protrusion structure, the protrusion structure being located outside the device section array, the direction of the first axis being different from the direction of the second axis, the second region extending in the direction of the first axis, the first and second scribe marks being provided in at least one of the first and second region, the first and second scribe marks being provided on the first and second reference lines, respectively, and the first and second reference lines extending in the direction of the second axis;
sandwiching the substrate product between films;
performing a first cleavage of the substrate product by use of the first scribe mark to form a first laser bar and another substrate product, the first laser bar and the other substrate product being sandwiched by the films, and
performing a second cleavage of the other substrate product by use of the second scribe mark to form a second laser bar and still another substrate product, the first and second reference lines defining a boundary of the other substrate product, and the protrusion structure being provided on the first and second reference line.

22. A method of fabricating a semiconductor laser, comprising the steps of:
forming a substrate product, the substrate product including a first region, a second region, and first and second scribe marks, the first region including plural device sections, the second region including a protrusion structure, the plural device sections being arranged in a direction of a first axis and a direction of a second axis, the direction of the first axis being different from the direction of the second axis, the second region extending in the direction of the first axis, the first and second scribe marks being provided in at least one of the first and second regions, the first and second scribe marks being provided on the first and second reference lines, respectively, and the first and second reference lines extending in the direction of the second axis;
sandwiching the substrate product between films;
performing a first cleavage of the substrate product by use of the first scribe mark to form a first laser bar and another substrate product, the first laser bar and the other substrate product being sandwiched by the films;
performing a second cleavage of the other substrate product by use of the second scribe mark to form a second laser bar and still another substrate product, the first and second reference lines defining a boundary of the other substrate product, and;
separating the first and second laser bars into laser chips,
wherein in the step of performing a first cleavage of the substrate product, the protrusion structure is separated into a first part and a second part, the first laser bar includes the first part, and the other substrate product includes the second part,
wherein in the step of performing a second cleavage of the substrate product, the second part of the protrusion structure is separated into a third part and a fourth part, the second laser bar includes the third part, and still another substrate product includes the fourth part, and
wherein each semi conductor laser chip does not include any part of the protrusion structure.

23. The method according to claim 1, wherein the substrate product includes a semiconductor substrate and a semiconductor laminate provided on the semiconductor substrate, the substrate product has a primary surface and a secondary surface opposite to the primary surface, the semiconductor laminate is provided between the primary surface and the semiconductor substrate, and the plural scribe marks are provided on the primary surface.

* * * * *